(12) United States Patent
Pereira et al.

(10) Patent No.: US 6,754,057 B2
(45) Date of Patent: Jun. 22, 2004

(54) CAPACITOR DAMAGE ARRESTOR

(75) Inventors: Robert A. Pereira, Spring, TX (US); D. Joseph Stoddard, San Jose, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 211 days.

(21) Appl. No.: 09/967,763

(22) Filed: Sep. 29, 2001

(65) Prior Publication Data

US 2003/0063417 A1 Apr. 3, 2003

(51) Int. Cl.[7] .................................................. H01G 2/12
(52) U.S. Cl. ...................... 361/15; 361/56; 361/91; 361/111; 361/126; 361/127; 361/763; 174/255; 174/260; 174/262
(58) Field of Search .......................... 361/15, 749, 750, 361/760, 748, 767, 772, 792, 56, 91, 111, 126, 127, 314, 325, 330, 763, 785–789, 395, 399, 412–415; 174/255, 256, 257, 260, 262, 264

(56) References Cited

U.S. PATENT DOCUMENTS

| | | | | |
|---|---|---|---|---|
| 5,006,963 A | * | 4/1991 | Spangler et al. | |
| 5,929,627 A | * | 7/1999 | MacPherson et al. | |
| 5,973,927 A | * | 10/1999 | Tanaka | |
| 6,058,022 A | * | 5/2000 | Gianni et al. | |

* cited by examiner

*Primary Examiner*—Dean A. Reichard
*Assistant Examiner*—Nguyen T. Ha

(57) ABSTRACT

A method for mounting a component on an assembly is provided, such as to prevent shorting between a voltage plane and a ground plane that may be caused when the component fails and generates temperature rises that result in insulation failure. The method includes removing a section of one or more of the group including a ground plane and a voltage plane in an area of the component, where the area of the section is selected to prevent damage to the component that can be caused by shorting between the ground plane and the voltage plane if insulation failure occurs.

19 Claims, 5 Drawing Sheets

CAPACITOR DAMAGE ARRESTOR

BACKGROUND OF THE INVENTION

1. Field of the Invention

The present invention relates to capacitor assemblies for printed circuit boards, and more specifically to preventing damage to a printed circuit board and other nearby components that can be caused by capacitor failure.

2. Description of the Related Art

The failure of a capacitor or certain other components in an integrated circuit is usually accompanied by generation of heat in the failed capacitor or component. In older integrated circuit designs, the heat generated by the failure of a capacitor was generally not significant, and did not cause damage to adjacent components. When there was a concern that damage could result, additional space would be provided between components, the amount of insulation between the ground plane and the voltage plane would be provided, fault detection circuitry would be provided for the power supply, or other expensive and inefficient procedures would be used.

The trend over time has been for integrated circuit assemblies to become more compact and to be placed in closer proximity to other integrated circuits. For example, the spacing between integrated circuit cards in a server has decreased as the density of components on integrated circuit boards has increased. Likewise, the amount of materials used for forming the integrated circuit board, such as the insulation between the ground plane and voltage plane, has decreased, such that the ground plane and the voltage plane are now separated by insulation having less thickness than has been used in the past. As a result of these various changes, damage from failed components can now spread more readily to other components or adjacent integrated circuits.

For example, fires have occurred in servers or other computing equipment that were caused by the failure of a single capacitor, such as a tantalum capacitor. These fires resulted when the failure of the capacitor caused shorting between the ground plane and the voltage plane, which occurred when the insulation underneath the capacitor and between the ground plane and the voltage plane was damaged or degraded by heat generated from the failed capacitor. The server power supply was not configured to detect the short between the ground plane and the voltage plane, and thus continued to feed energy to the fault. As the current delivered to the failing capacitor and printed circuit board may have been within normal system operating ranges, detection of the fault would have required signal processing circuitry to detect signals indicative of fault, and may have been undetectable from the power supply by conventional means. The high energy level of the fault caused continued burning of the insulation, which spread to adjacent integrated circuit boards. In a short period of time, many integrated circuit boards were burning in the server, generating significant amounts of smoke. The smoke caused fire protection equipment in the computer room in which the server was housed to activate, thus damaging large amounts of equipment, causing the computing facility to shut down, causing loss of data and causing other damage and detrimental effects.

SUMMARY OF THE INVENTION

A component damage arrestor according to the invention is provided that prevents a damaged component from causing adjacent components to fail. The component damage arrestor uses the removal of the ground plane and voltage plane from the area adjacent to the capacitor to prevent shorting of the ground plane to the voltage plane when the component fails. In the disclosed embodiment, the component damage arrestor allows localized insulation damage to occur but prevents the damage from allowing the ground plane and the voltage plane to short together, so as to prevent sustaining the damage mechanism and expanding the damage.

BRIEF DESCRIPTION OF THE SEVERAL VIEWS OF THE DRAWINGS

A better understanding of the present invention can be obtained when the following detailed description of the preferred embodiment is considered in conjunction with the following drawings, in which.

DETAILED DESCRIPTION OF THE INVENTION

Figure 1A:
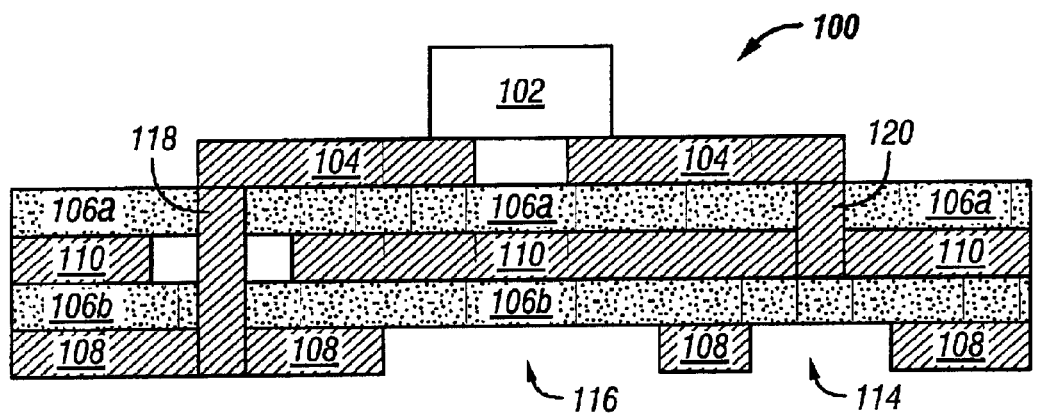
FIGS. 1A and 1B illustrate a component assembly in accordance with an exemplary embodiment of the invention.
Figure 1B:
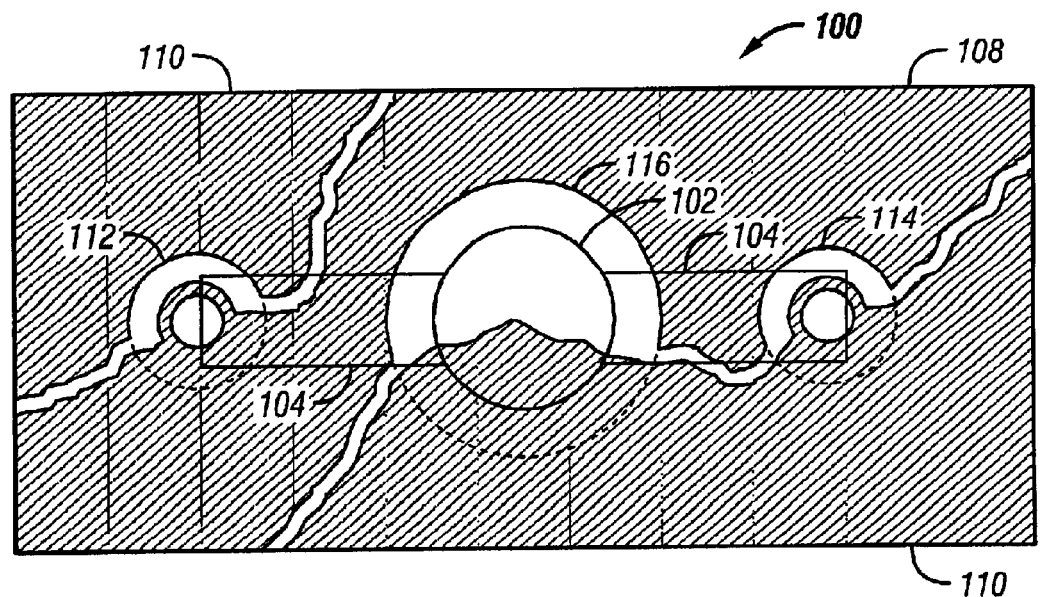

Turning to FIGS. 1A–1B, a component assembly 100 is shown. Component assembly 100 includes component 102 and component support 104, which is used to secure the component to an integrated circuit board. An insulation layer 106a is disposed underneath component 102 and support 104, and support 104 rests against insulation layer 106a. Ground plane 110 is disposed underneath insulation layer 106a. A second insulation layer 106b is disposed between ground plane 110 and voltage plane 108.

As shown in FIG. 1B, ground plane well 112 and voltage plane well 114 have also been formed. Ground plane well 112 and voltage plane well 114 are areas of ground plane 110 and voltage plane 108, respectively, that have been removed in the vicinity of voltage plane lead 118 and ground plane lead 120, respectively. In this manner, in the event component 102 fails and generates heat, such that the heat is conducted through component support 104 to ground plane lead 120 and voltage plane lead 118, then any damage to insulation 106 that occurs in the vicinity of ground plane lead 120 and voltage plane lead 118 will not result in a short circuit forming between ground plane 110 and voltage plane 108. Thus, the amount of ground plane 110 to be removed for ground plane well 112 and the amount of voltage plane 108 to be removed for voltage plane well 114 can be determined based on the amount of heat that will be generated by component 102 in the event of failure, an analysis of heat transmission through ground plane lead 120 and voltage plane lead 118 and into ground plane 110 and voltage plane 108, and other suitable factors.

Furthermore, component assembly 100 includes voltage plane well 116, which is a section of voltage plane 108 that has been removed beneath component 102. As shown in FIG. 1, voltage plane well 116 allows insulation 106b in the area underneath component 102 to be damaged and to fail without causing shorting between voltage plane 108 and ground plane 110. The size of voltage plane well 116 can also be determined using a thermal analysis of heat flows generated by failure of component 102.

In operation, component support 100 allows component 102 to fail and generate heat during failure without causing shorting between voltage plane 108 and ground plane 110. Ground plane well 112 and voltage plane well 114 prevent heat transmission through voltage plane lead 118 and ground plane lead 120, respectively, from damaging insulation 106a or 106b in an area where shorting can occur between voltage plane 108 and ground plane 110. Likewise, voltage plane well 116 further removes areas in which shorting can occur between voltage plane 108 and ground plane 110 when insulation 106b is damaged by the failure of component 102. In this manner, the failure of component 102, while causing some amount of anticipated damage to insulation layers 106a and 106b, does not result in shorting between voltage plane 108 and ground plane 110.

Furthermore, ground plane well 112 can be used to prevent damage to voltage plane lead 118 that may be caused by violation of registration tolerances when the layers of the integrated circuit board are assembled. In one exemplary embodiment, integrated circuit board is formed by placing layers, such as ground plane 110, insulation layer 106b, voltage plane 108 and insulation layer 106a, on top of each other in a manufacturing process. Registration points in each layer are identified, and these registration points are used to align these layers and form the integrated circuit board. Registration tolerances refers to the amount of non-alignment that can be tolerated between layers, such as in areas where a voltage plane lead 118 or ground plane lead 120 must penetrate through one or more via's in these layers. If the registration alignment of these components exceeds registration tolerances, then damage can occur to the insulation or leads. Ground plane well 112 can be used to minimize or eliminate the probability of shorting caused by violation of such registration tolerances.

Figure 2A:
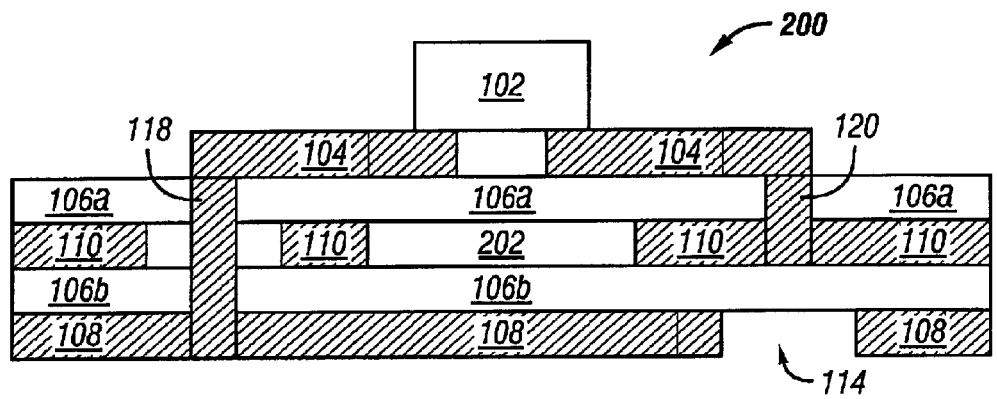
FIGS. 2A and 2B illustrate a component assembly that utilizes another exemplary embodiment of voltage plane wells and ground plane wells to prevent damage of a failed component from spreading to adjacent components and adjacent integrated circuits.
Figure 2B:
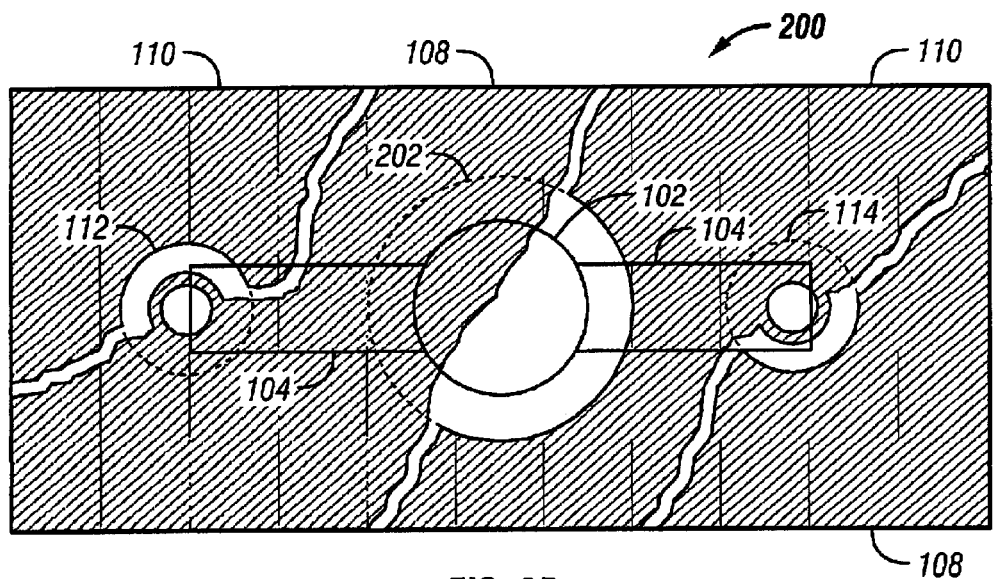

Turning now to FIGS. 2A–2B, a component assembly 200 is shown that utilizes another exemplary embodiment of voltage plane wells and ground plane wells to prevent damage of a failed component from spreading to adjacent components and adjacent integrated circuits. In this exemplary embodiment, ground plane well 202 is added, and voltage plane well 116 is not provided, such that failure of component 102 does not result in shorting between ground plane 110 and voltage plane 108 if insulation 106b fails underneath component 102. Component assembly 200 can be used where additional mechanical support from voltage plane 108 is required that prevents the use of voltage plane well 116 of FIG. 1, or for other suitable reasons.

Figure 3A:
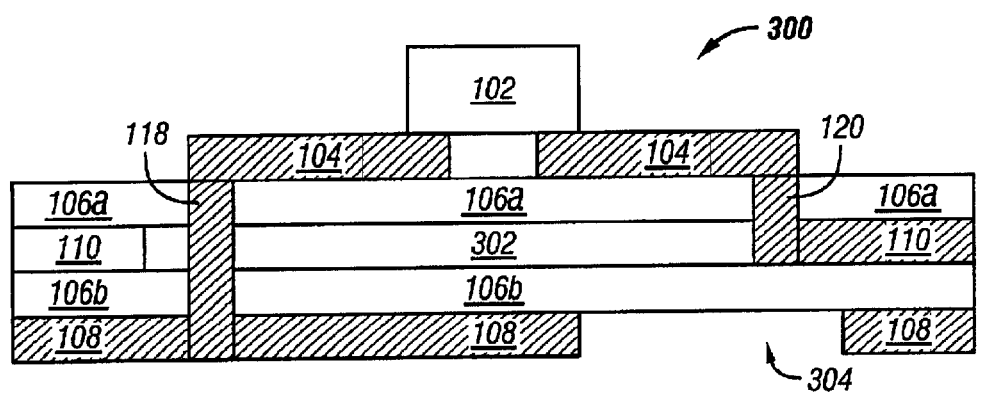
FIGS. 3A–3B illustrate a component assembly having another exemplary ground plane well and voltage plane well.
Figure 3B:
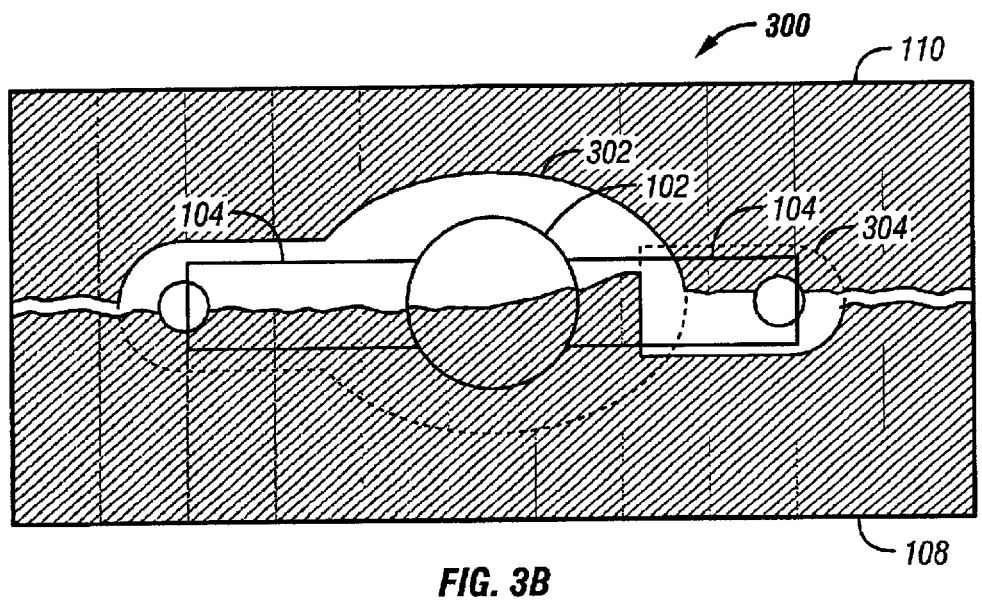

Turning now to FIGS. 3A–3B, a component assembly 300 is shown having ground plane well 302 and voltage plane well 304. In this exemplary embodiment, ground plane well 302 and voltage plane well 304 provide additional separation between ground plane 110 and voltage plane 108 to prevent shorting in the event of insulation damage by heating of component 102. Likewise, manufacturing of ground plane well 302 and voltage plane well 304 may be easier than other configurations, and can also be used to prevent damage due to violation of registration tolerances. Component assembly 300 can be used in configurations where mechanical support requirements for component 102 by ground plane 110 allows the removal of ground plane 110 in ground plane well 302.

Figure 4A:
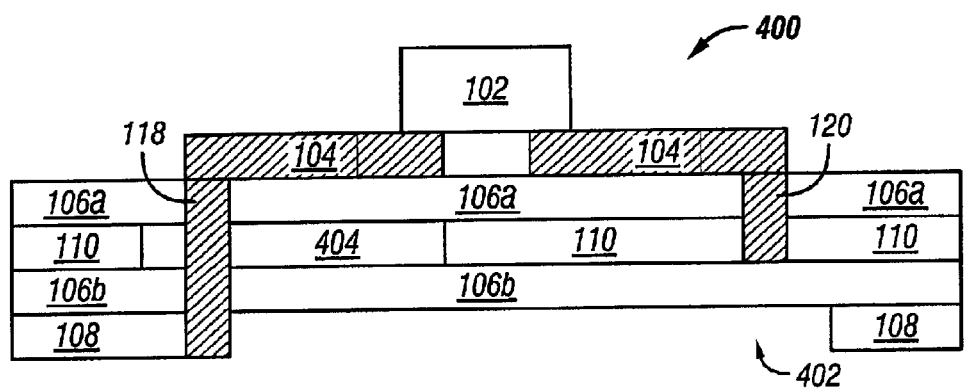
FIGS. 4A–4B illustrate a component assembly in accordance with another exemplary embodiment of the present invention.
Figure 4B:
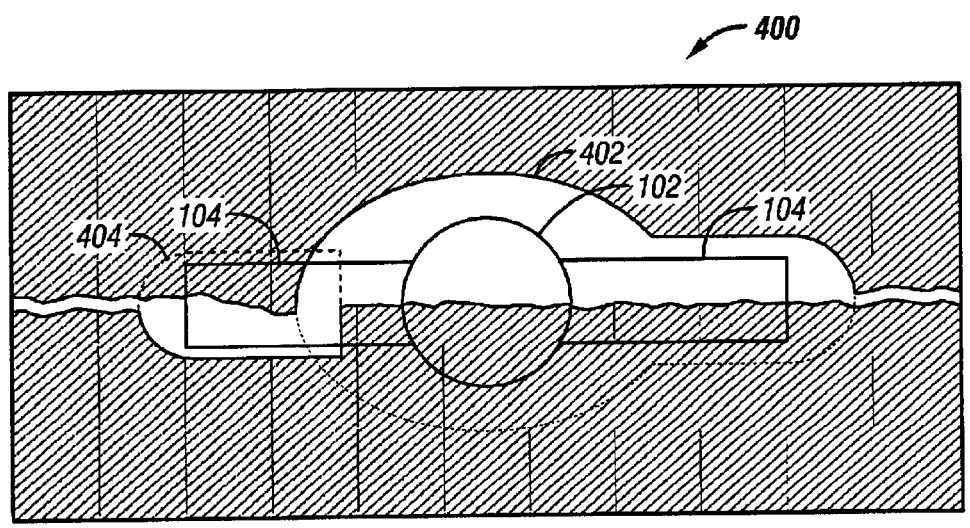

Turning now to FIGS. 4A–4B, component assembly 400 is shown in accordance with another exemplary embodiment of the present invention. Component assembly 400 includes voltage plane well 402 and ground plane well 404. In this exemplary embodiment, supplemented separation of ground plane 110 and voltage plane 108 is provided to prevent shorting from occurring in the event of insulation 106a and 106b failure, although it will be noted that additional support of component 102 can not be provided by ground plane 110.

Figure 5:
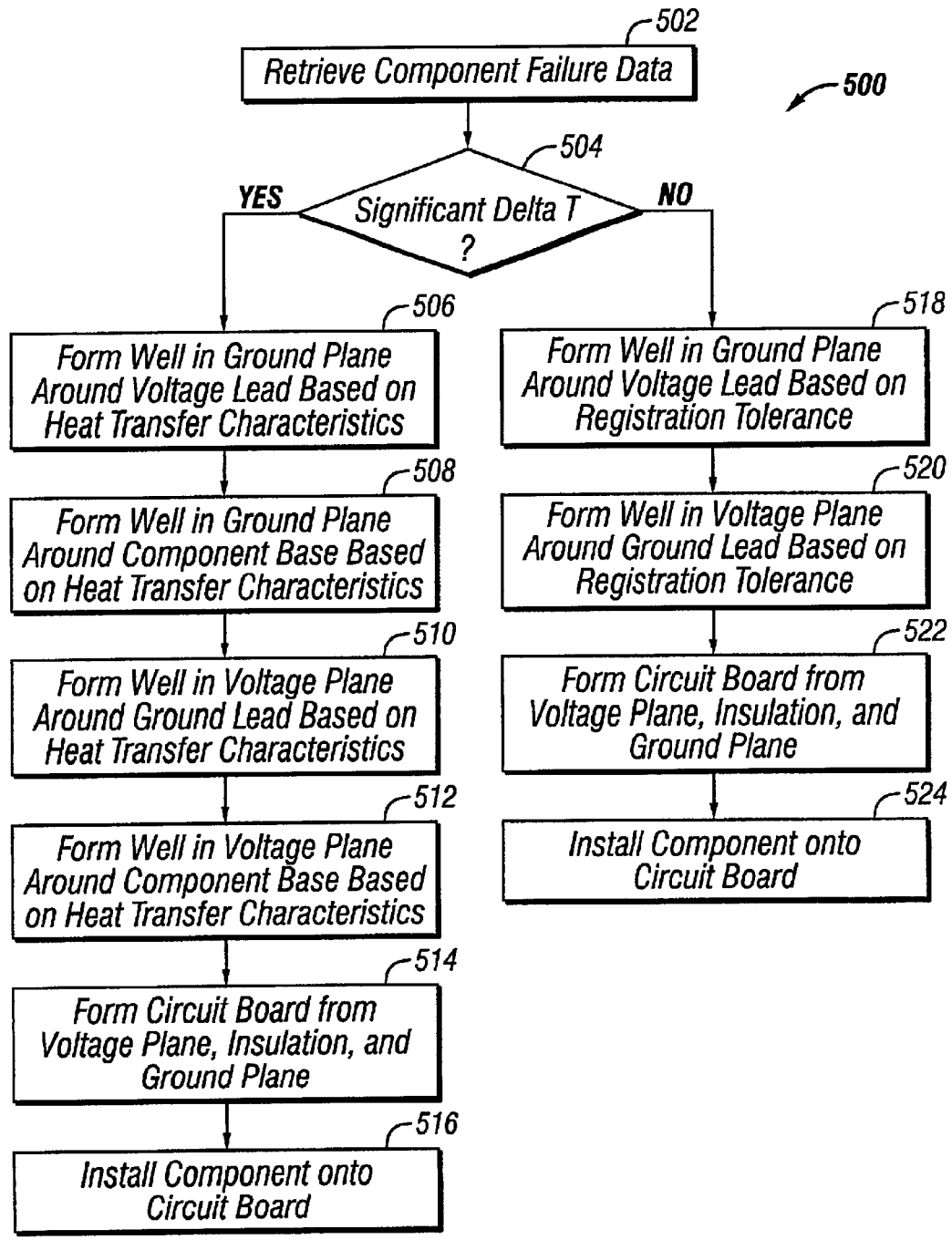
FIG. 5 is a flow diagram of a method for providing one or more ground plane wells or voltage plane wells in a component support assembly in accordance with an exemplary embodiment of the present invention.

Turning now to FIG. 5, a method for providing one or more ground plane wells or voltage plane wells in a component support assembly is presented in accordance with an exemplary embodiment of the present invention. Method 500 begins at 502 where component failure data is retrieved. In one exemplary embodiment, component failure data can be obtained by testing components in a manner to cause failure, and then measuring the amount of heat generated by the component during failure. Likewise, other suitable sources of component failure data can be used. Method 500 then proceeds to 504.

At 504, it is determined whether significant temperature rises could be generated by the component. In one exemplary embodiment, a finite element thermal model can be used to analyze the component based on measured or estimated amount of heat generated by the component when it fails, so as to determine heat dissipation, temperature rise, and other suitable data. If it is determined at 504 that significant temperature rises are generated the method then proceeds to 506.

At 506, a well is formed in the ground plane around the voltage lead based on the heat transfer characteristics of the component assembly. In one exemplary embodiment, the well can be sized such that conservative estimates of insulation damage that can occur when component failure occurs will not result in the mechanical failure of insulation in areas where the ground plane could be placed in contact with the voltage plane. In addition, the size of the ground plane well can also be based on mechanical analysis of the amount of support required by the ground plane to prevent mechanical failure of the component assembly. The method then proceeds to 508.

At 508, a well is formed in the ground plane around the component base as a function of heat transfer and temperature rise in the event of component failure. In one exemplary embodiment, the levels of temperature rise determined by an analysis performed at 504 may need to be re-performed based on heat transfer in the absence of the ground plane as a result of formation of ground plane wells, voltage plane wells, or other suitable configurations. Furthermore, the mechanical support required of the component or other mechanical considerations can also be provided to determine the size of the ground plane well around the component base. The method then proceeds to 510.

At 510, a well is formed in the voltage plane around the ground lead based on the heat transfer characteristics of the component assembly. In one exemplary embodiment, the well can be sized such that conservative estimates of insulation damage that can occur when component failure occurs will not result in the mechanical failure of insulation in areas where the ground plane could be placed in contact with the voltage plane. In addition, the size of the voltage plane well can also be based on mechanical analysis of the amount of support required by the voltage plane to prevent mechanical failure of the component assembly. The method then proceeds to 512.

At 512, a well is formed in the voltage plane around the component base as a function of heat transfer and temperature rise in the event of component failure. In one exemplary embodiment, the levels of temperature rise determined by an analysis performed at 504 or 508 may need to be re-performed based on heat transfer in the absence of the ground plane, the voltage plane or the ground plane and the voltage as a result of formation of ground plane wells, voltage plane wells, or other suitable configurations. Furthermore, the mechanical support required of the component or other mechanical considerations can also be provided to determine the size of the voltage plane well around the component base. The method then proceeds to 514. (One of ordinary skill in the art will recognize that one or more of steps 506, 508, 510, and 512 can be omitted based upon the results of the thermal analysis, the mechanical support requirements, or other design factors that make the need to perform those steps unnecessary.)

At 514 the circuit board is formed from the voltage plane, the insulation, and the ground plane. In one exemplary embodiment, a predetermined number of registration points can be used to align the layers of the circuit board, and the circuit board can be formed by assembling the layers and bonding them with epoxy, heating a bonding agent to cause the layers to fuse together, or other suitable processes. The method then proceeds to 516.

At 516 the component is installed onto the circuit board including one or more ground plane wells or voltage plane wells.

If it is determined at 504 that significant temperature rises will not be generated by the component failure, the method then proceeds to 518. At 518, a ground plane well is formed around the voltage lead based on registration tolerances. In one exemplary embodiment, it may be determined that registration tolerances are exceeded by an amount that can be statistically determined. The well in the ground plane around the voltage lead can be formed based on the maximum expected registration tolerance violation, mechanical considerations for the amount of the support that is required from the ground plane at that point, and other factors. The method then proceeds to 520.

At 520, a voltage plane well is formed around the ground lead based on registration tolerances. In one exemplary embodiment, the well in the voltage plane around the ground lead can be formed based on the maximum expected registration tolerance violation, mechanical considerations for the amount of the support that is required from the voltage plane at that point, and other factors. Likewise, the assembly of the circuit board may make the need for either the voltage plane well or the ground plane well unnecessary for the purpose of preventing damage from violation of registration tolerances. The removal of additional material from the insulation layers can also be used to increase the size of vias in the insulation layers to prevent related damage. The method then proceeds to 522.

At 522 the circuit board is formed from the voltage plane, the insulation, and the ground plane, such as by using a predetermined number of registration points to align the layers of the circuit board and by bonding the layers with epoxy, heating a bonding agent to cause the layers to fuse together, or other suitable processes. The method then proceeds to 524.

At 524 the component is installed onto the circuit board including one or more ground plane wells or voltage plane wells.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A printed circuit board assembly comprising:
    a ground plane;
    a voltage plane;
    a first ground plane well associated with a voltage lead of a component;
    a second ground plane well underneath the component, wherein the first and second ground plane wells comprise respective areas in the ground plane where material has been removed;
    a first voltage plane well associated with a ground lead of the component;
    a second voltage plane well underneath the component, wherein the first and second voltage plane wells comprise respective areas in the voltage plane where material of the voltage plane has been removed; and
    wherein the first ground plane well, the second ground plane well, the first voltage plane well, and the second voltage plane well are configured to prevent damage to other components when the component fails.

2. The printed circuit board assembly of claim 1, wherein the component is a tantalum capacitor and the damage is damage to other components caused by burning insulation.

3. The circuit board assembly of claim 1, further comprising an insulation layer between the voltage plane and the ground plane, wherein the first ground plane well, second ground plane well, first voltage plane well, and second voltage plane well are located to prevent shorting of the ground plane and voltage plane due to damage of the insulation layer caused by overheating of the component.

4. A circuit board comprising:
    a component;
    a ground plane;
    a voltage plane;
    an insulation layer between the ground plane and the voltage plane; and
    a first well formed in one of the ground plane and voltage plane, the first well comprising an area of the one of the ground plane and voltage plane where a material of the one of the ground plane and voltage plane has been removed,
    the first well formed in proximity to the component to prevent shorting of the ground plane and the voltage plane in response to damage of the insulation layer due to overheating of the component.

5. The circuit board of claim 4, wherein the component is a tantalum capacitor.

6. The circuit board of claim 4, wherein the first well is formed in the ground plane, the circuit board further comprising a second well formed in the voltage plane, the second well comprising an area of the voltage plane where a material of the voltage plane has been removed,
    the second well formed in proximity to the component to prevent shorting of the ground plane and the voltage plane in response to damage of the insulation layer due to overheating of the component.

7. The circuit board of claim 6, further comprising a first lead connecting the capacitor to the ground plane, and a second lead connecting the capacitor to the voltage plane, the first lead extending along a first axis through the circuit board, and the second lead extending along a second axis through the circuit board;

the second well surrounding the first axis, and the first well surrounding the second axis.

8. The circuit board of claim 6, wherein the first well surrounds the second lead, and the second well is underneath the first lead.

9. The circuit board of claim 8, further comprising a third well formed in the voltage plane, the third well underneath the component.

10. The circuit board of claim 8, further comprising a third well formed in the ground plane, the third well underneath the component.

11. The circuit board of claim 6, wherein the component and second lead occupy a first width of the circuit board, and wherein the first well has a width larger than the first width.

12. The circuit board of claim 11, wherein the first well overlaps the component and the second lead.

13. The circuit board of claim 6, wherein the component and first lead occupy a first width of the circuit board, wherein the second well has a width larger than the first width.

14. The circuit board of claim 13 wherein the second well over laps the component and the first lead.

15. The circuit board of claim 6, further comprising a first lead connecting the capacitor to the ground plane, and a second lead connecting the capacitor to the voltage plane, wherein the first well overlaps the second lead, and the second well overlaps the first lead.

16. The circuit board of claim 15, further comprising a third well formed in the voltage plane, the third well overlapping the component.

17. The circuit board of claim 15, further comprising a third well formed in the ground plane, the third well overlapping the component.

18. The circuit board of claim 15, wherein the first well is adapted to prevent shorting of the voltage plane and ground plane in response to damage of the insulation layer due to overheating by the second lead.

19. The circuit board of claim 18, wherein the second well is adapted to prevent shorting of the voltage plane and ground plane in response to damage of the insulation layer due to overheating by the first lead.

* * * * *